(12) United States Patent
Wang

(10) Patent No.: US 6,580,642 B1
(45) Date of Patent: Jun. 17, 2003

(54) METHOD OF ERASING NONVOLATILE TUNNELING INJECTOR MEMORY CELL

(75) Inventor: Chih Hsin Wang, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/135,916

(22) Filed: Apr. 29, 2002

(51) Int. Cl.[7] .............................................. G11C 16/04
(52) U.S. Cl. .................... 365/185.18; 257/214; 257/316
(58) Field of Search ..................... 365/185.18; 257/316, 257/214

(56) References Cited

U.S. PATENT DOCUMENTS

| 6,449,189 B2 * | 9/2002 | Mihnea et al. ......... 365/185.18 |
| 2001/0019151 A1 | 9/2001 | Caywood ................... 257/321 |

* cited by examiner

Primary Examiner—David Nelms
Assistant Examiner—Tu-Tu Ho
(74) Attorney, Agent, or Firm—Gray Cary Ware & Freidenrich LLP

(57) ABSTRACT

A method of erasing a non volatile memory cell having a floating gate disposed over and insulated from a semiconductor substrate by a gate insulation layer, a grid electrode disposed over and insulated from the floating gate, and an injector electrode disposed over and insulated from the grid electrode. The substrate includes source and drain regions with a channel region defined therebetween. The method includes the steps of applying a first voltage to the substrate, and applying a second voltage to the grid electrode and to the injector electrode, wherein the first voltage is sufficiently more positive with respect to the second voltage to induce electrons on the floating gate to tunnel through the gate insulation layer to the substrate via Fowler-Nordheim tunneling.

9 Claims, 2 Drawing Sheets

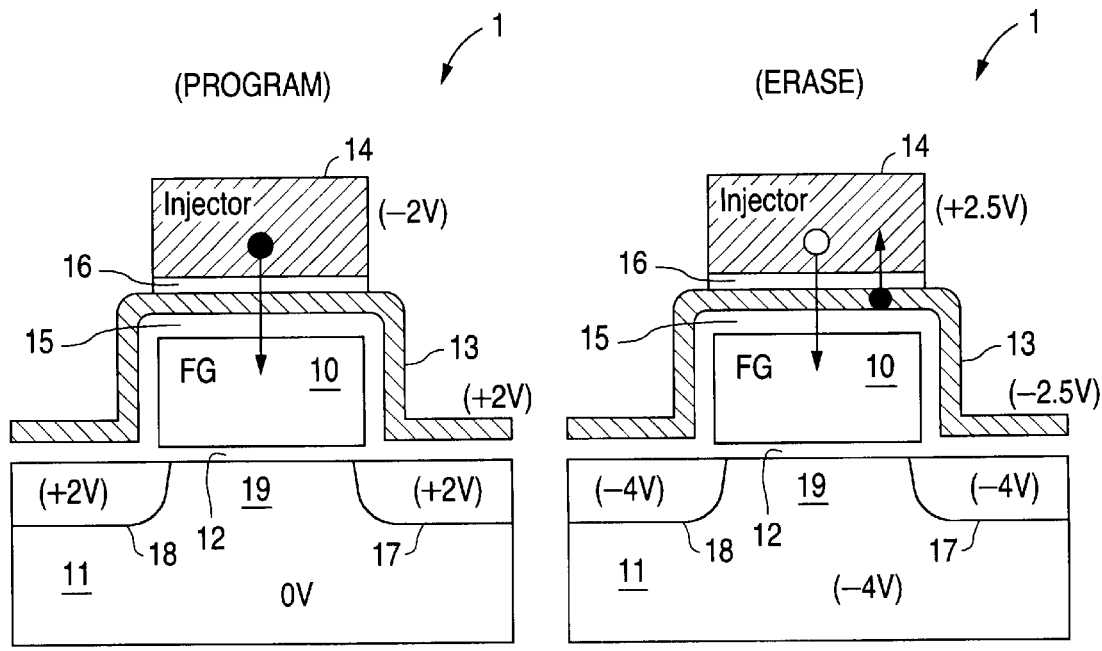
FIG. 1A
(PRIOR ART)
FIG. 2A
(PRIOR ART)
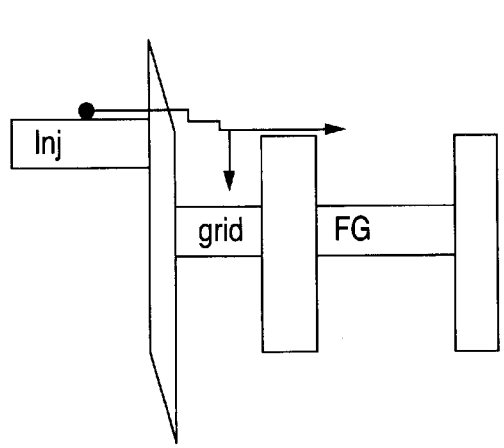
FIG. 1B
(PRIOR ART)
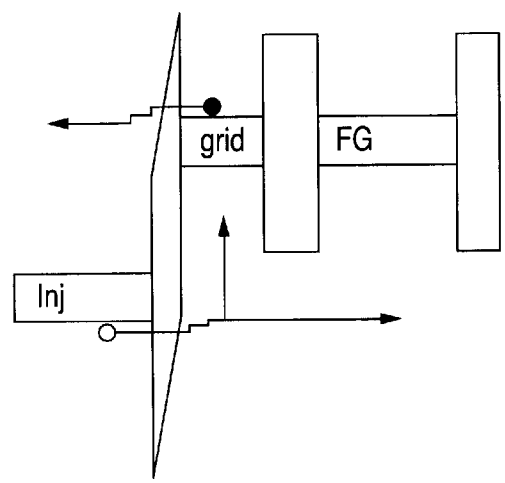
FIG. 2B
(PRIOR ART)

FIG. 3A  FIG. 4A

METHOD OF ERASING NONVOLATILE TUNNELING INJECTOR MEMORY CELL

FIELD OF THE INVENTION

The present invention relates to nonvolatile memory devices, and more particularly to a novel method of erasing a negatively charged floating gate of an MOS nonvolatile tunneling injector memory cell.

BACKGROUND OF THE INVENTION

Non-volatile semiconductor memory cells using a floating gate to store charges thereon and memory arrays of such non-volatile memory cells formed in a semiconductor substrate are well known in the art.

One such non-volatile memory cell has been proposed in U.S. Published application Ser. No. 2001/0019151 A1, which is hereby incorporated by reference. The tunneling injector memory cell 1 is programmed and erased by injection of electrons and holes respectively on the floating gate. The basic cell structure is shown in FIGS. 1A and 2A, and includes a floating gate 10 disposed over and insulated from a substrate 11 by a gate insulation layer 12. A grid electrode 13 is disposed over the floating gate 10, and an injector electrode 14 is disposed over the grid electrode 13. The grid electrode 13 and floating gate 10 are insulated from each other by a retention insulator layer 15 disposed therebetween. Likewise, injector electrode 14 and grid electrode 13 are insulated from each other by a grid insulator layer 16 disposed therebetween. Source and drain regions 17/18 are formed in the substrate 11, defining a channel region 19 therebetween above which the floating gate 10 is disposed.

The programming of the memory cell is illustrated in FIGS. 1A, and 1B. When injector electrode 14 is negatively biased with respect to the grid electrode, electrons will tunnel from the injector electrode to the grid electrode 13. When this negative bias is increased beyond a certain value (e.g. −3.8 V), some of the electrons will reach the interface between the grid electrode 13 and the retention insulator 15 with enough energy to surmount the energy barrier of the retention insulator 15. When the potential of the floating gate 10 is positive with respect to the grid electrode potential (i.e. by about 0.5 to 1.0 V), most of the electrons that surmount the energy barrier of the retention insulator 15 will be collected on the floating gate 10. In this manner, the floating gate is negatively charged. Example potentials of −2V (applied to the injector electrode 14), +2V (applied to the grid electrode 13) and +2V (applied to the source/drain regions 17/18) are illustrated in FIG. 1A for negatively charging the floating gate 10.

The erasure of the memory cell is illustrated in FIGS. 2A and 2B, which is essentially done by reversing the polarity of the potentials applied to the memory cell electrodes. Specifically, when injector electrode 14 is positively biased with respect to the grid electrode, electrons will tunnel from the grid electrode 13 to the injector electrode 14. When this positive bias is increased beyond a certain value, holes from the injector electrode 14 have enough energy to surmount the grid insulation layer 16. When the potential of the floating gate 10 is negative with respect to the grid electrode potential (i.e. by about 0.5 to 1.0 V), the injected holes are collected on the floating gate 10. In this manner, the negative charge on the floating gate is neutralized. Example potentials of +2.5V (applied to the injector electrode), −2.5V (applied to the grid electrode 13) and −4V (applied to the source/drain regions 17/18 and substrate 11) are illustrated in FIG. 2A for erasing the negative charge on the floating gate 10.

The material used for the grid electrode 13 can be silicon (e.g. polysilicon or in amorphous form) or other conductive materials (such as tungsten). Polysilicon is illustrated in FIG. 2 due to its well proven yieldability, manufacturability, and compatibility with state of the art IC technology. In the above described erasure method, the injection efficiency (i.e. the fraction of holes injected from the injector electrode 14 that reach the floating gate 10) is expected to be between 0.01% to 0.1%. Moreover, approximately 1 million electrons are needed to tunnel to the injector electrode 14 in order to get each hole injected onto the floating gate 10. A relatively high electrical current between the grid electrode 13 and the injector electrode 14 is therefore needed to inject a significant number of holes onto the floating gate 10. Thus, the high electron current places a practical limit on the injection of holes onto the floating gate.

There is a need for an erasure method for a tunneling injector memory cell that does not necessitate a high electron current in order to erase negative charges from the floating gate.

SUMMARY OF THE INVENTION

The present invention solves the aforementioned problem by providing an erasure method that does not employ a high grid electrode electrical current to erase the negative charge from the floating gate of a tunneling injector non-volatile memory cell.

The present invention is a method of operating a non volatile memory cell having a floating gate disposed over and insulated from a semiconductor substrate by a gate insulation layer, a grid electrode disposed over and insulated from the floating gate, and an injector electrode disposed over and insulated from the grid electrode, wherein the substrate includes source and drain regions that define a channel region of the substrate therebetween. The method comprising the steps of applying a first voltage to the substrate, and applying a second voltage to at least one of the grid electrode and the injector electrode. The first voltage is sufficiently more positive with respect to the second voltage to induce electrons on the floating gate to tunnel through the gate insulation layer to the substrate via Fowler-Nordheim tunneling.

Another aspect of the present invention is a method of operating a non volatile memory cell having a floating gate disposed over and insulated from a semiconductor substrate by a gate insulation layer, a grid electrode disposed over and insulated from the floating gate, and an injector electrode disposed over and insulated from the grid electrode, wherein the substrate includes source and drain regions that define a channel region of the substrate therebetween. The method comprising the steps of programming the memory cell and erasing the memory cell. Programming the memory cell includes the stops of applying a first voltage to the injector electrode, and applying a second voltage to the grid electrode, wherein the second voltage is sufficiently more positive relative to the first voltage to induce electrons to be injected from the injector electrode, through the grid electrode, and onto the floating gate. Erasing the memory cell includes the steps of applying a third voltage to the substrate, and applying a fourth voltage to at least one of the grid electrode and the injector electrode, wherein the third voltage is sufficiently more positive with respect to the fourth voltage to induce electrons on the floating gate to tunnel through the gate insulation layer to the substrate via Fowler-Nordheim tunneling.

Other objects and features of the present invention will become apparent by a review of the specification, claims and appended figures.

BRIEF DESCRIPTION OF THE DRAWINGS

FIG. 1A is a cross sectional view of a known tunneling injector non-volatile memory cell, illustrating the known programming thereof.

FIG. 1B is a bandgap diagram of the structure of FIG. 1A, illustrating the known programming thereof.

FIG. 2A is a cross sectional view of the known tunneling injector non-volatile memory cell, illustrating the known erasure thereof.

FIG. 2B is a bandgap diagram of the structure of FIG. 2A, illustrating the known erasure thereof.

FIG. 3A is a cross sectional view of the tunneling injector non-volatile memory cell, illustrating the erasure method of the present invention.

FIG. 4A is a cross sectional view of the tunneling injector non-volatile memory cell, illustrating an alternate erasure method of the present invention.

DETAILED DESCRIPTION OF THE PREFERRED EMBODIMENTS

The present invention is an improved method of erasing a negative charge from the floating gate of a non-volatile tunneling injector memory cell.

Figure 3B:
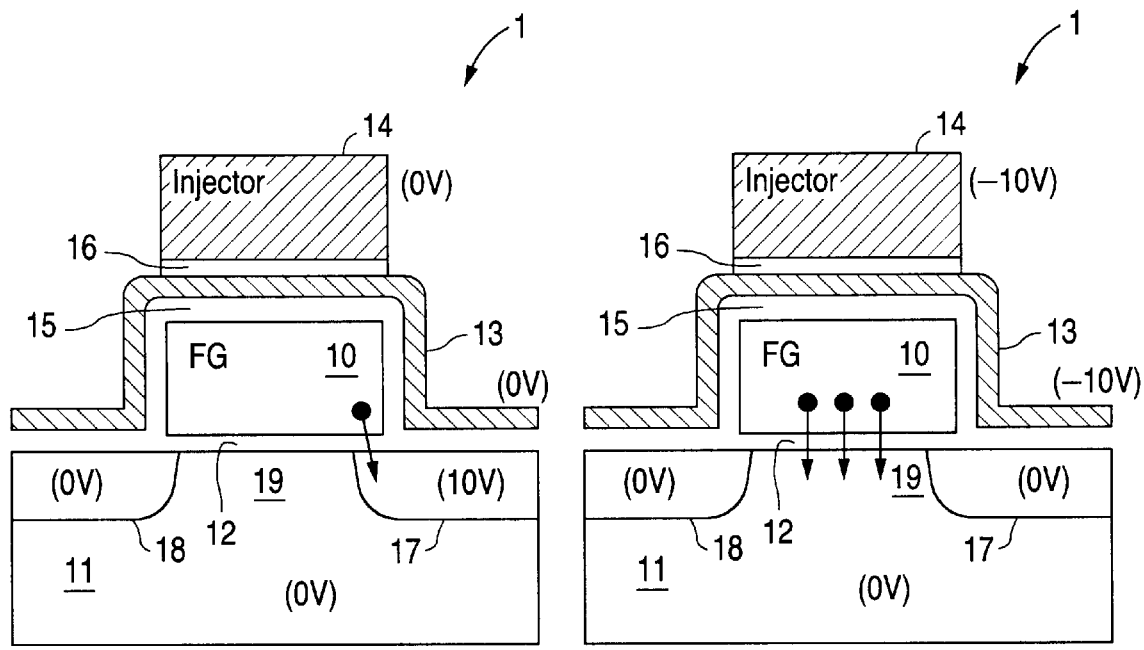
FIG. 3B is a bandgap diagram of the structure of FIG. 3A, illustrating the erasure method of the present invention.
Figure 3B:
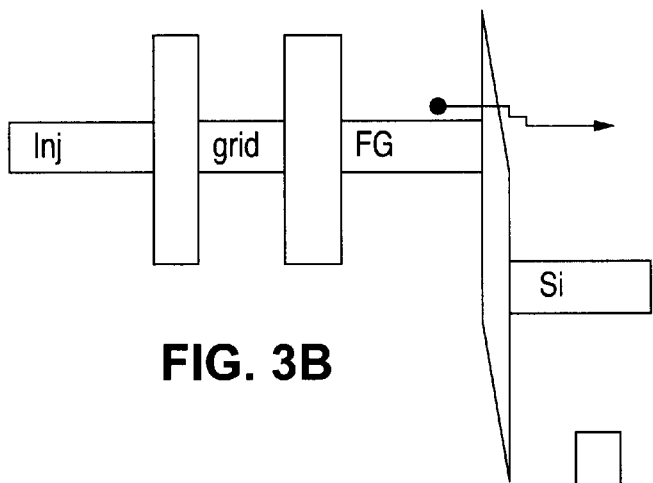

FIGS. 3A and 3B illustrate the erasure method of the present method. The structure and method of making the tunneling injector memory cell 1, as well as the method of programming the memory cell 1, is described above with respect to FIGS. 1A–B and 2A–B, as well as in U.S. Published application Ser. No. 2001/0019151 A1, which is hereby incorporated by reference.

In contrast with the injection of holes for erasing the negative charge from floating gate 10, the method of the present invention utilizes Fowler-Nordheim tunneling between the floating gate 10 and the source region 17 to erase the tunneling injector memory cell 1. Specifically, as illustrated in FIGS. 3A and 3B, a relatively high voltage (e.g. 10 V) is applied to the source region 17, while the remaining memory cell elements are left at ground potential. If the floating gate 1 is negatively charged, and the voltage applied to the source region 17 is sufficiently high, electrons will tunnel through the gate insulation layer 12 to the source region 17 via Fowler-Nordheim tunneling, thus erasing the negative charge from the floating gate 10. This erasure scheme negates the need for excessive electron currents from the grid electrode 13 in order to erase the memory cell 1.

Figure 4B:
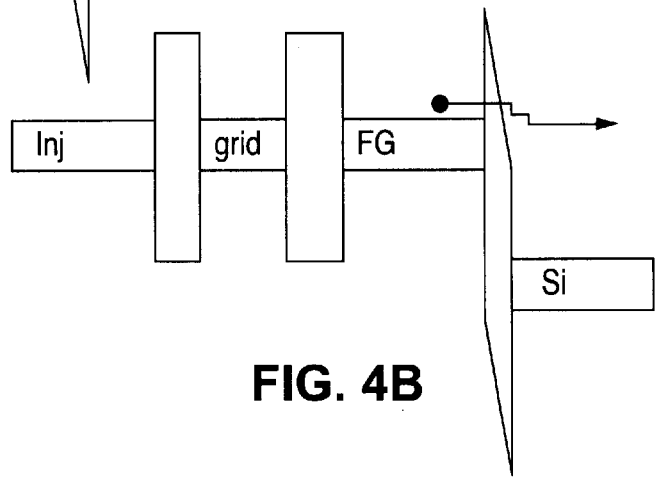
FIG. 4B is a bandgap diagram of the structure of FIG. 4A, illustrating the alternate erasure method of the present invention.

FIGS. 4A and 4B illustrate an alternate embodiment of the present invention, where the source region 17 is left at ground potential, and a relatively high negative voltage (e.g. −10 V) is applied to both the grid electrode 13 and the injector electrode 14. If the floating gate 1 is negatively charged, and the negative voltage applied to the grid and injector electrodes 13/14 is great enough, the electrons on the floating 10 are driven via Fowler-Nordheim tunneling through gate insulation layer 12 to the substrate 11.

It is to be understood that the present invention is not limited to the embodiments described above and illustrated herein, but encompasses any and all variations falling within the scope of the appended claims. For example, those skilled in the art know that source and drain can be switched during operation, and therefore drain 18 could be used instead of or in combination with source region 17 to erase the memory cell shown in FIG. 3A. Or, the positive voltage shown in FIG. 3A applied source region 17 could additionally or instead be applied to the channel region 19 of the substrate. Moreover, while electrons are shown in FIG. 4A as being received by the channel region 19 of substrate 11, the electrons could also be received by the source/drain regions 17/18 of the substrate 11. Further, the tunneling injector memory cell is shown as formed in a substrate that is uniformly doped with one conductivity type (e.g. P type) with source and drain regions 17/18 doped with a different conductivity type (e.g. N type). However, it is well known and contemplated by the present invention that the channel, source and drain regions can be formed in a well region of the substrate, which has a different conductivity type than other portions of the substrate. Lastly, while the voltages shown in each of the FIGS. 3A and 4A for the injector and grid electrodes are shown to be the same, these voltages can be different so long as the voltage difference between injector 14 and grid 13 is lower than the breakdown voltage of the grid insulation layer 16. Thus, it is possible to leave the injector electrode 14 floating when a large voltage (e.g. −10V) is applied to the grid electrode 13.

What is claimed is:

1. A method of operating a non volatile memory cell having a floating gate disposed over and insulated from a semiconductor substrate by a gate insulation layer, a grid electrode disposed over and insulated from the floating gate, and an injector electrode disposed over and insulated from the grid electrode, wherein the substrate includes source and drain regions that define a channel region of the substrate therebetween, the method comprising the steps of:

applying a first voltage to the substrate; and applying a second voltage to at least one of the grid electrode and the injector electrode;

wherein the first voltage is sufficiently more positive with respect to the second voltage to induce electrons on the floating gate to tunnel through the gate insulation layer to the substrate via Fowler-Nordheim tunneling.

2. The method of claim 1, further comprising the step of:

applying a third voltage to the injector electrode; and applying a fourth voltage to the grid electrode;

wherein the fourth voltage is sufficiently more positive relative to the third voltage to induce electrons to be injected from the injector electrode, through the grid electrode, and onto the floating gate.

3. The method of claim 1, wherein the first voltage is a positive voltage and the second voltage is a ground voltage.

4. The method of claim 3, wherein the first voltage is applied to at least one of the source and drain regions, and wherein the electrons tunnel to the at least one source and drain regions of the substrate.

5. The method of claim 1, wherein the first voltage is a ground voltage and the second voltage is a negative voltage, and wherein the electrons tunnel to the channel region of the substrate.

6. A method of operating a non volatile memory cell having a floating gate disposed over and insulated from a semiconductor substrate by a gate insulation layer, a grid electrode disposed over and insulated from the floating gate, and an injector electrode disposed over and insulated from the grid electrode, wherein the substrate includes source and drain regions that define a channel region of the substrate therebetween, the method comprising the steps of:

programming the memory cell by:
    applying a first voltage to the injector electrode, and
    applying a second voltage to the grid electrode,
        wherein the second voltage is sufficiently more positive relative to the first voltage to induce electrons to be injected from the injector electrode, through the grid electrode, and onto the floating gate; and
erasing the memory cell by:
    applying a third voltage to the substrate, and
    applying a fourth voltage to at least one of the grid electrode and the injector electrode,
        wherein the third voltage is sufficiently more positive with respect to the fourth voltage to induce electrons on the floating gate to tunnel through the gate insulation layer to the substrate via Fowler-Nordheim tunneling.

7. The method of claim 6, wherein the third voltage is a positive voltage and the fourth voltage is a ground voltage.

8. The method of claim 7, wherein the third voltage is applied to at least one of the source and drain regions, and wherein the electrons tunnel to the at least one source and drain regions of the substrate.

9. The method of claim 6, wherein the third voltage is a ground voltage and the fourth voltage is a negative voltage, and wherein the electrons tunnel to the channel region of the substrate.

* * * * *